(12) United States Patent
Choi et al.

(10) Patent No.: US 12,020,757 B2
(45) Date of Patent: Jun. 25, 2024

(54) MEMORY DEVICE FOR GENERATING PUMP CLOCK AND OPERATING METHOD OF THE MEMORY DEVICE

(71) Applicant: SK hynix Inc., Icheon-si (KR)

(72) Inventors: Won Jae Choi, Icheon-si (KR); Min Su Kim, Icheon-si (KR); Hyun Chul Cho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 191 days.

(21) Appl. No.: 17/550,234

(22) Filed: Dec. 14, 2021

(65) Prior Publication Data

US 2023/0024668 A1  Jan. 26, 2023

(30) Foreign Application Priority Data

Jul. 26, 2021  (KR) ........................ 10-2021-0097567

(51) Int. Cl.
*G11C 16/32*  (2006.01)
*G11C 16/10*  (2006.01)
*G11C 16/14*  (2006.01)
*G11C 16/26*  (2006.01)
*G11C 16/30*  (2006.01)

(52) U.S. Cl.
CPC ............ *G11C 16/32* (2013.01); *G11C 16/102* (2013.01); *G11C 16/14* (2013.01); *G11C 16/26* (2013.01); *G11C 16/30* (2013.01)

(58) Field of Classification Search
None
See application file for complete search history.

(56) References Cited

U.S. PATENT DOCUMENTS

| 2015/0102857 A1* | 4/2015 | Kang ................ G11C 16/30 327/540 |
| 2019/0034330 A1* | 1/2019 | Natarajan ........... G11C 29/021 |
| 2021/0366555 A1 | 11/2021 | Choi et al. |

FOREIGN PATENT DOCUMENTS

| KR | 1020100028192 A | 3/2010 |
| KR | 1020150042041 A | 4/2015 |

OTHER PUBLICATIONS

Mario Sako et al., A Low-Power 64Gb MLC NAND-Flash Memory in 15nm CMOS Technology, IEEE International Solid-State Circuits Conference, ISSCC 2015 / Session 7 / Non-Volatile Memory Solutions / 7.1, Feb. 24, 2015.

* cited by examiner

*Primary Examiner* — Alfredo Bermudez Lozada
(74) *Attorney, Agent, or Firm* — WILLIAM PARK & ASSOCIATES LTD.

(57) ABSTRACT

A memory device including a plurality of memory cells, a peripheral circuit, and control logic. The peripheral circuit is configured to generate a plurality of operating voltages used in a memory operation, based on a target pump clock, and perform the memory operation by using the plurality of operating voltages. The control logic is configured to select the target pump clock among a plurality of pump clocks, based on a number of data bits which selected memory cells on which the memory operation is to be performed among the plurality of memory cells store, and control the peripheral circuit to perform the memory operation on the selected memory cells.

18 Claims, 11 Drawing Sheets

| # of Data Bit | Operation Mode | Pump Clock |
|---|---|---|
| 1 | OM1 | CLK1 |
| 2 | OM2 | CLK2 |
| ⋮ | ⋮ | ⋮ |
| n | OMn | CLKn |

131b

| Power Consumption Level | Operation Mode | Pump Clock |
|---|---|---|
| 1 | OM1 | CLK1 |
| 2 | OM2 | CLK2 |
| ⋮ | ⋮ | ⋮ |
| n | OMn | CLKn |

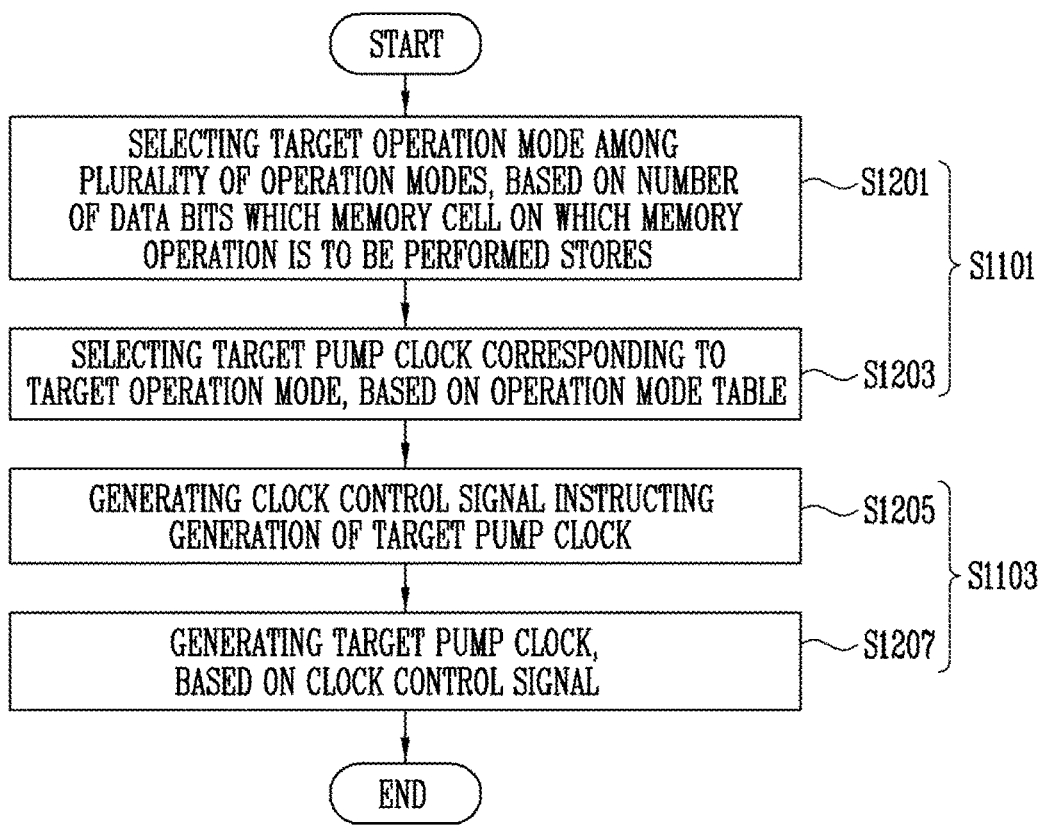

MEMORY DEVICE FOR GENERATING PUMP CLOCK AND OPERATING METHOD OF THE MEMORY DEVICE

CROSS-REFERENCE TO RELATED APPLICATION

The present application claims priority under 35 U.S.C. § 119(a) to Korean patent application number 10-2021-0097567, filed on Jul. 26, 2021, in the Korean Intellectual Property Office, the entire disclosure of which is incorporated herein by reference.

BACKGROUND

1. Technical Field

The present disclosure generally relates to an electronic device, and more particularly, to a memory device and an operating method of the memory device.

2. Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

In accordance with an aspect of the present disclosure, there may be provided a memory device including: a plurality of memory cells; a peripheral circuit configured to generate a plurality of operating voltages used in a memory operation, based on a target pump clock, and perform the memory operation by using the plurality of operating voltages; and control logic configured to select the target pump clock among a plurality of pump clocks, based on a number of data bits which selected memory cells on which the memory operation is to be performed among the plurality of memory cells store, and control the peripheral circuit to perform the memory operation on the selected memory cells.

In accordance with another aspect of the present disclosure, there may be provided a method for operating a memory device including a plurality of memory cells, the method including: determining a target pump clock among a plurality of pump clocks, based on a number of data bits which selected memory cells on which a memory operation is to be performed among the plurality of memory cells store; generating a plurality of operating voltages used in the memory operation, based on the target pump clock; and performing the memory operation by using the plurality of operating voltages.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 8 is a diagram illustrating an operation mode table used by an operation mode storage shown in FIG. 2.

FIG. 12 is a flowchart illustrating in detail the flowchart shown in FIG. 11.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Some embodiments provide a memory device having improved power consumption in a memory operation and an operating method of the memory device.

Figure 1:
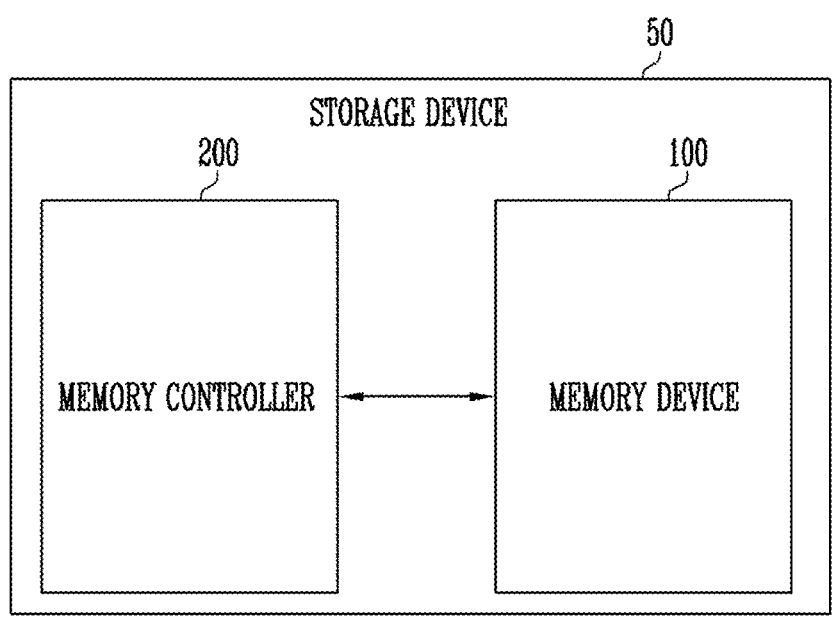
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is assumed and described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control the memory devices according to an interleaving scheme to improve operational performance. The interleaving scheme may be an operating scheme that allows operation periods of at least two memory devices 100 to overlap with each other.

The host may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
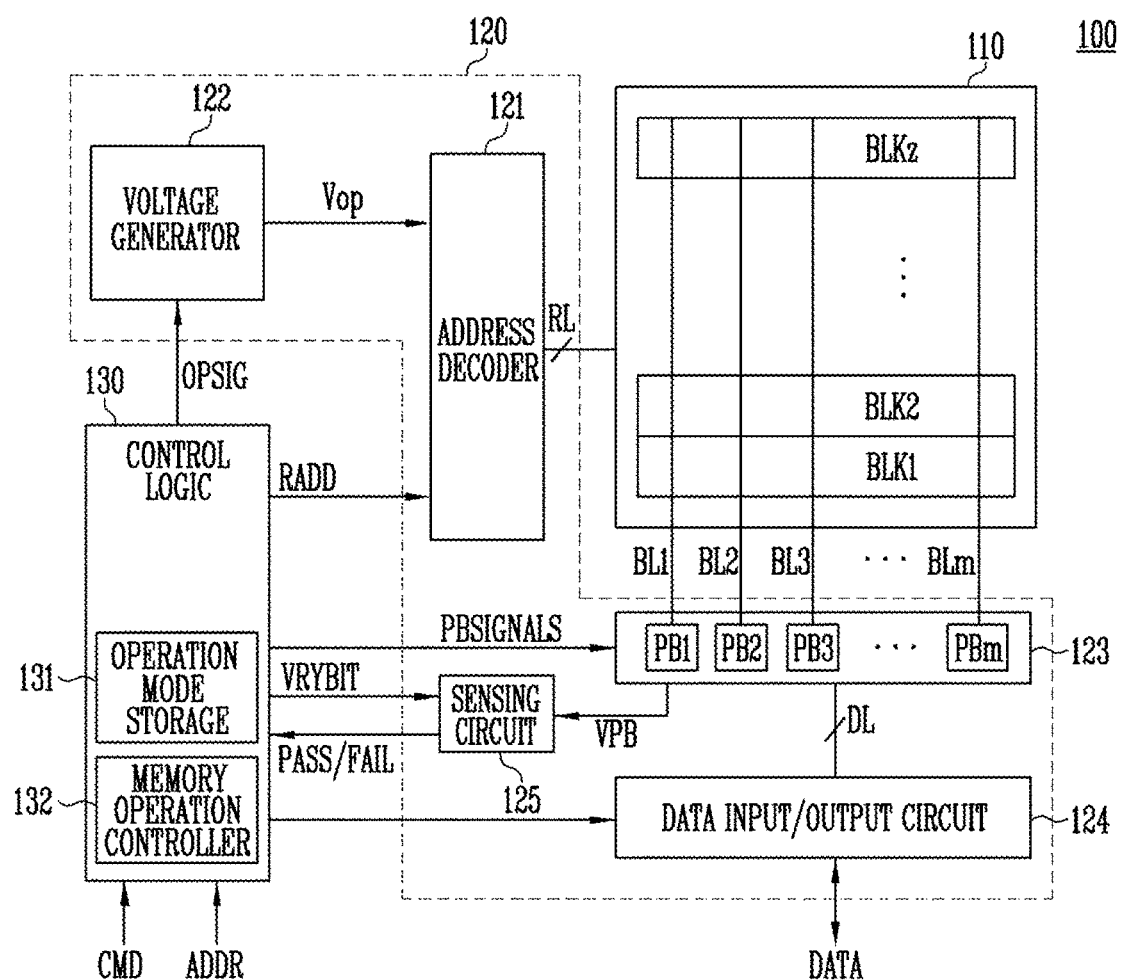
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be connected in series between a drain select transistor and memory cells and between a source select transistor and the memory cells.

Each of the memory cells of the memory device may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may perform a program operation, a read operation, or an erase operation on the memory cell array 110.

The address decoder 121 is connected to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives a row address RADD of an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of a selected memory block according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least one memory block according to the decoded block address. In the erase operation, the address decoder 121 may apply a ground voltage to word lines connected to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130. The plurality of generated operating voltages Vop may be supplied to the memory cell array 110 by the address decoder 121.

In an embodiment, the voltage generator 122 may generate a plurality of operating voltages Vop used in a memory operation, based on a target pump clock. The voltage generator 122 may generate the target pump clock in response to a clock control signal, and generate the plurality of operating voltages Vop, based on the target pump clock. The plurality of operating voltages Vop may include at least one of a program voltage, an erase voltage, a pass voltage, a verify voltage, a read voltage, and a negative voltage.

The read/write circuit 123 includes first to mth page buffers PB1 to PBm. The first to mth page buffers PB1 to PBm are connected to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The selected memory cells are programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is connected to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/write circuit 123 and a reference voltage generated by the reference current.

The control logic 130 may be connected to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the peripheral circuit 120 may generate a plurality of operating voltages, based on a target pump clock. The peripheral circuit 120 may perform a memory operation on a selected memory cell among a plurality of memory cells by using the plurality of operating voltages. The memory operation may include at least one among a program operation, an erase operation, and a read operation.

The control logic 130 may select a target pump clock among a plurality of pump clocks, based on a number of data bits which selected memory cells on which the memory operation is to be performed among the plurality of memory cells store. The control logic 130 may control the peripheral circuit 120 to perform the memory operation on the selected memory cells.

In an embodiment, the control logic 130 may include an operation mode storage 131 and a memory operation controller 132.

The operation mode storage 131 may store an operation mode table including a plurality pump clocks respectively corresponding to a plurality of operation modes. At least one pump clock among the plurality of pump clocks may have a frequency different from that of another pump clock.

The memory operation controller 132 may select a target operation mode among the plurality of operation modes, based on a command CMD received from outside the memory device 100. In an embodiment, the memory operation controller 132 may select a target operation mode among the plurality of operation modes, based on a command CMD received from, for example, the memory controller 200. The memory operation controller 132 may select a target pump clock corresponding to the target operation mode, based on the operation mode table.

In an embodiment, the memory operation controller 132 may select a target operation mode among the plurality of operation modes, based on a number of data bits which selected memory cells store. The memory operation is performed on the selected memory cells according to the command CMD. The memory operation controller 132 may select, as the target pump clock, a pump clock having a lower frequency among the plurality of pump clocks as the number of data bits which the selected memory cells are to store becomes smaller. In another embodiment, the memory operation controller 132 may select, as the target pump clock, a pump clock having a lower frequency among the plurality of pump clocks as power consumption required in the memory block becomes smaller.

The memory operation controller 132 may generate a clock control signal instructing generation of the target pump clock. The clock control signal may be included in the operation signal OPSIG.

Figure 3:
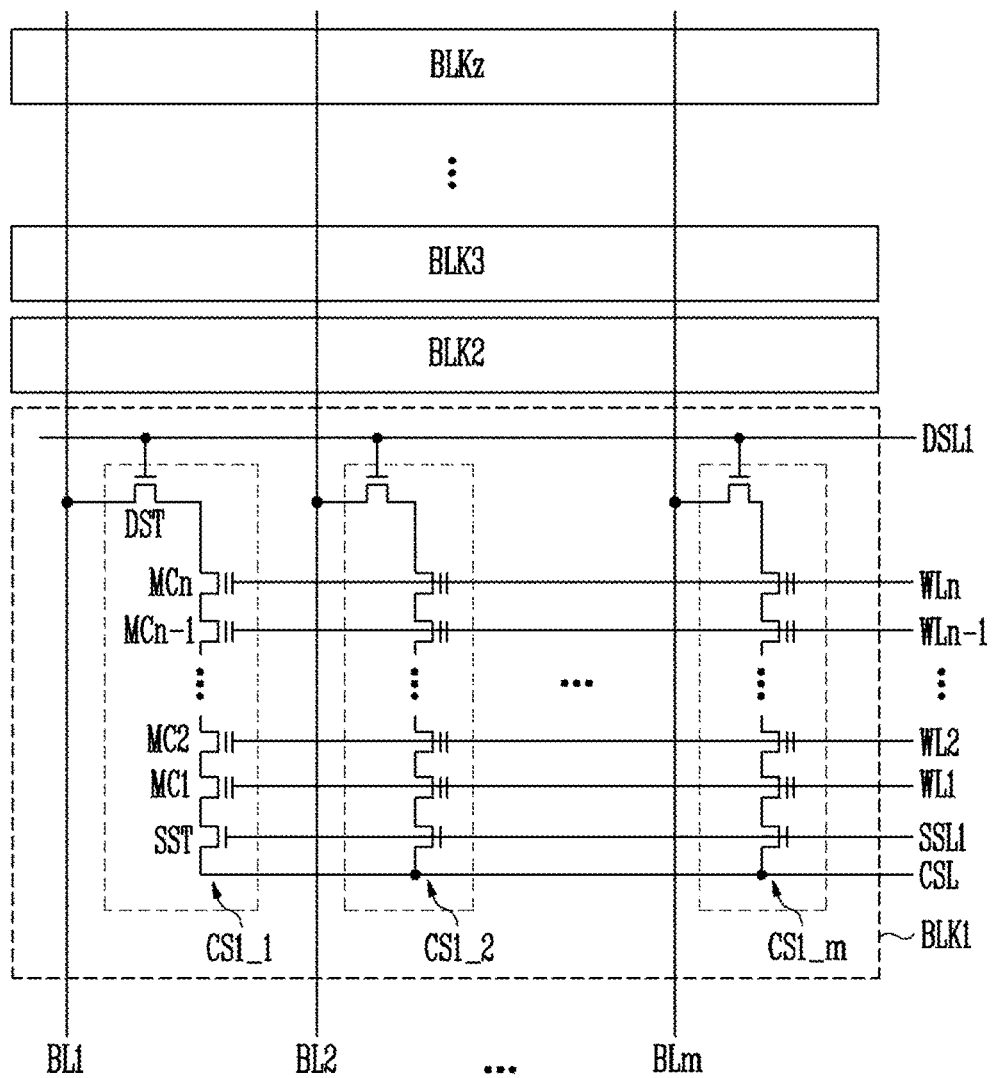
FIG. 3 is a diagram illustrating a memory cell array shown in FIG. 2.

FIG. 3 is a diagram illustrating the memory cell array shown in FIG. 2.

Referring to FIG. 3, the memory cell array 110 may include first to zth memory blocks BLK1 to BLKz are commonly connected to the first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_m (m is a positive integer). First to mth cell strings CS1_1 to CS1_m are respectively connected to the first to mth bit lines BL1 to BLm. Each of the first to mth cell strings CS1_1 to CS1_m includes a drain select transistor DST, a plurality of memory cells MC1 to MCn (n is a positive integer) connected in series, and a source select transistor SST.

A gate terminal of the drain select transistor DST included in each of the first to mth cell strings CS1_1 to CS1_m is connected to a drain select line DSL1. Gate terminals of first to nth memory cells MC1 to MCn included in each of the first to mth cell strings CS1_1 to CS1_m are respectively connected to first to nth word lines WL1 to WLn. A gate terminal of the source select transistor SST included in each of the first to mth cell strings CS1_1 to CS1_m is connected to a source select line SSL1.

For convenience of description, a structure of a cell string will be described based on the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST included in the first cell string CS1_1 is connected to the first bit line BL1. A source electrode of the drain select transistor DST included in the first cell string CS1_1 is connected to a drain terminal of the nth memory cell MCn included in the first cell string CS1_1. The first to nth memory cells MC1 to MCn are connected in series to each other. A drain terminal of the source select transistor SST included in the first cell string CS1_1 is connected to a source terminal of the first memory cell MC1 included in the first cell string CS1_1. A source terminal of the source select transistor SST included in the first cell string CS1_1 is connected to a common source line CSL. In an embodiment, the common source line CSL may be commonly connected to the first to zth memory blocks BLK1 to BLKz.

The drain select line DSL1, the first to nth word lines WL1 to WLn, and the source select line SSL1 are included in the row lines RL shown in FIG. 2. The drain select line DSL1, the first to nth word lines WL1 to WLn, and the source select line SSL1 is controlled by the address decoder 121 shown in FIG. 2. The common source line CSL may be controlled by the control logic 130 shown in FIG. 2. The first to mth bit lines BL1 to BLm are controlled by the read/write circuit 123 shown in FIG. 2.

Figure 4:
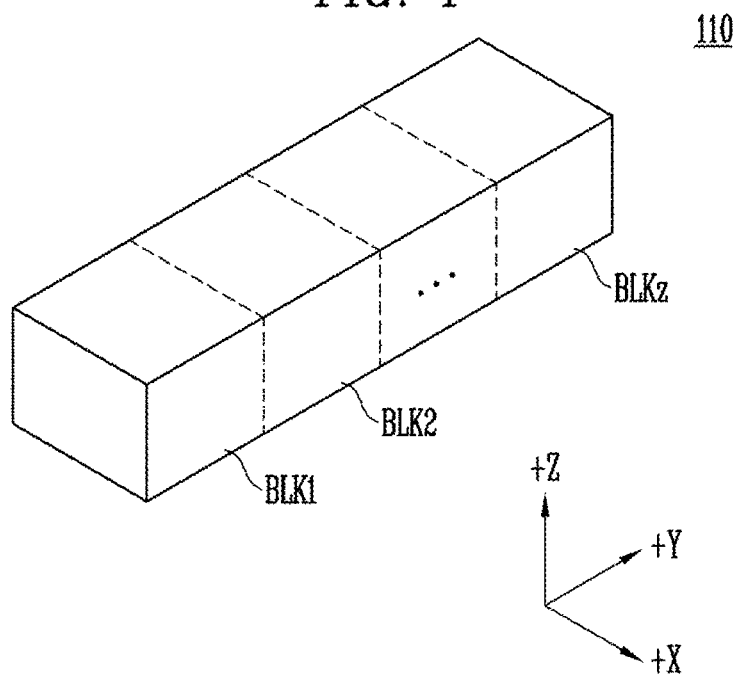
FIG. 4 is a diagram illustrating another embodiment of the memory cell array shown in FIG. 2.

FIG. 4 is a diagram illustrating another embodiment of the memory cell array shown in FIG. 2.

Referring to FIG. 4, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 5 and 6.

Figure 5:
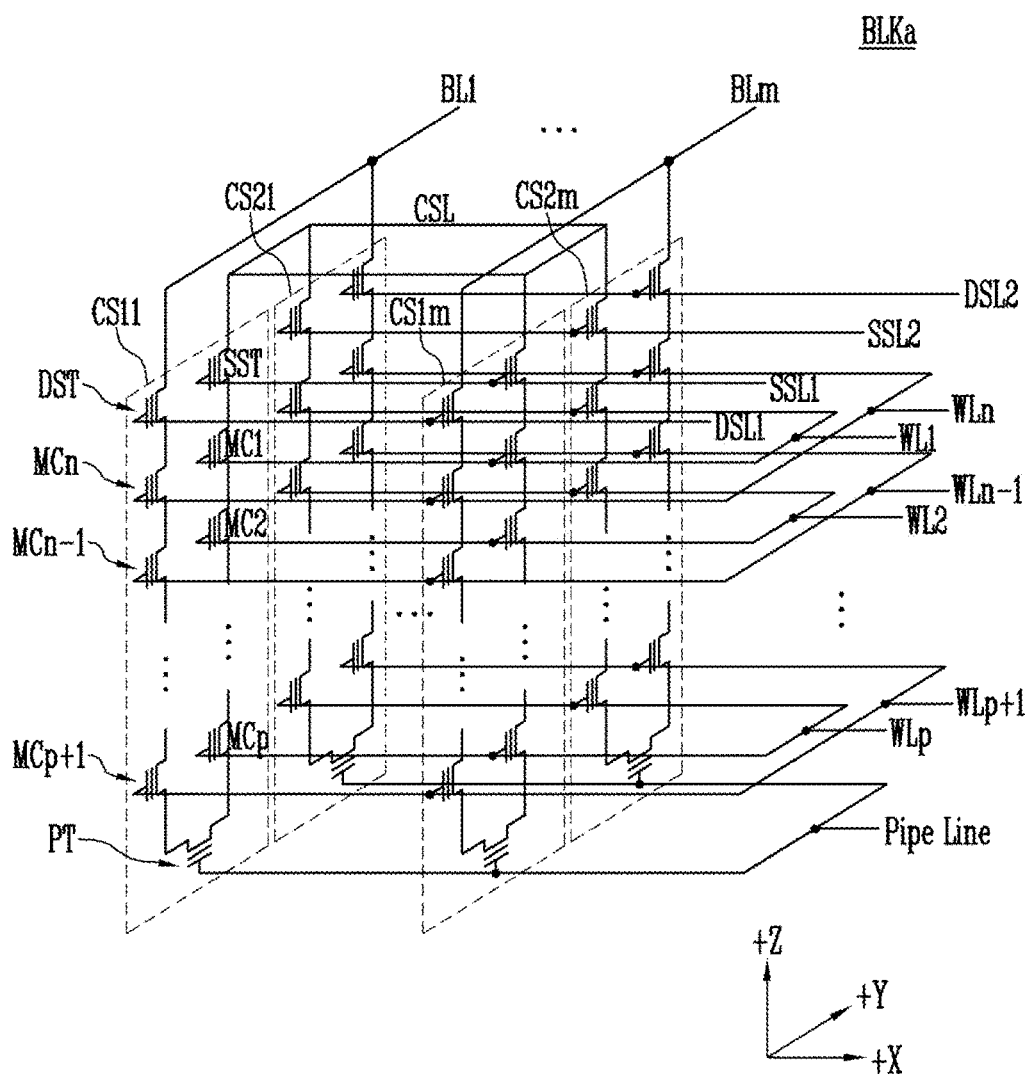
FIG. 5 is a circuit diagram illustrating any one memory block among memory blocks shown in FIG. 4.

FIG. 5 is a circuit diagram illustrating any one memory block BLKa among the memory blocks BLK1 to BLKz shown in FIG. 4.

Referring to FIG. 5, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 5 illustrates two cell strings arranged in a column direction (i.e., a +Y direction). However, this is for convenience of description, and it will be understood that three cell strings may be arranged in the column direction.

In an embodiment, one memory block may include a plurality of sub-blocks. One sub-block may include cell strings arranged in a 'U' shape on one column.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 5, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 5, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory is cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, by controlling a voltage applied to the dummy word lines connected to the respective dummy memory cells, the dummy memory cells can have the required threshold voltage.

Figure 6:
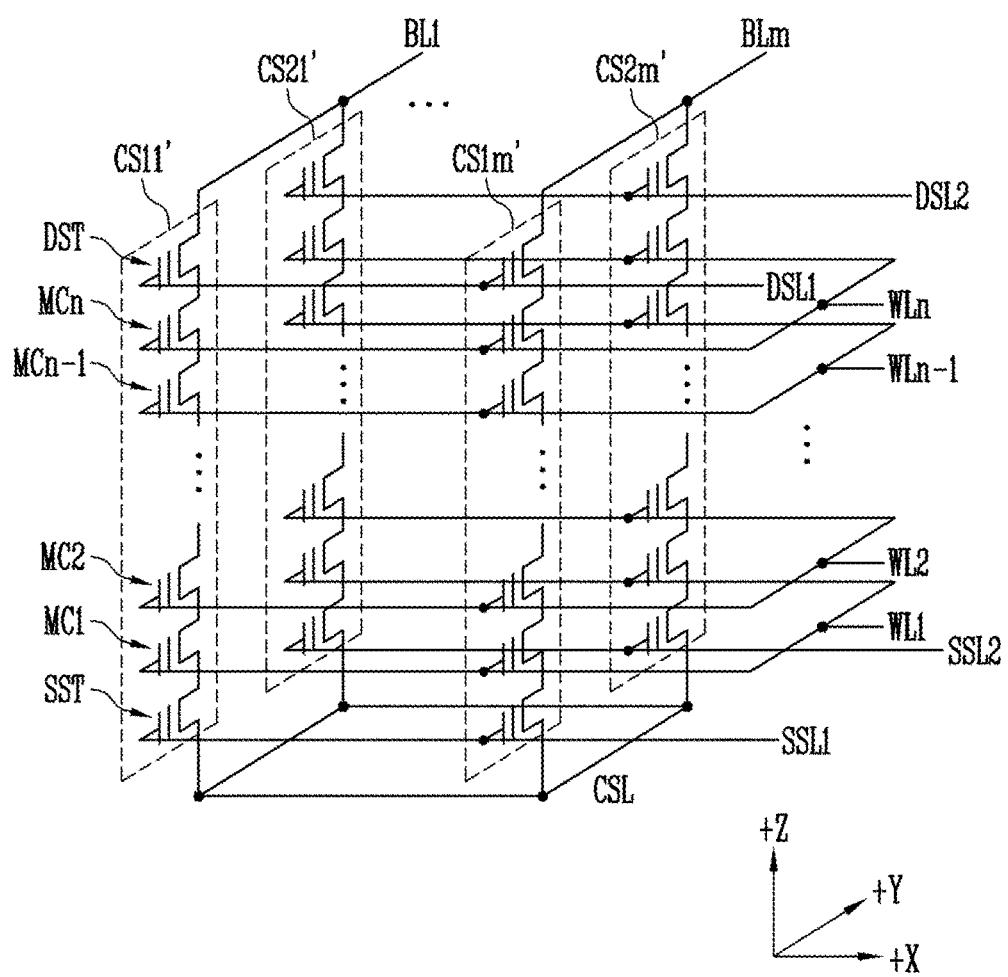
FIG. 6 is a circuit diagram illustrating another embodiment of the one memory block among the memory blocks shown in FIG. 4.

FIG. 6 is a circuit diagram illustrating another embodiment BLKb of the one memory block among the memory blocks BLK1 to BLKz shown in FIG. 4.

Referring to FIG. 6, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

In an embodiment, one memory block may include a plurality of sub-blocks. One sub-block may include cell strings arranged in an 'I' shape on one column.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 6 has a circuit similar to that of the memory block BLKa of FIG. 5, except that the pipe transistor PT is excluded from each cell string in FIG. 6.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, by controlling a voltage applied to the dummy word lines connected to the respective dummy memory cells, the dummy memory cells can have the required threshold voltage.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 7:
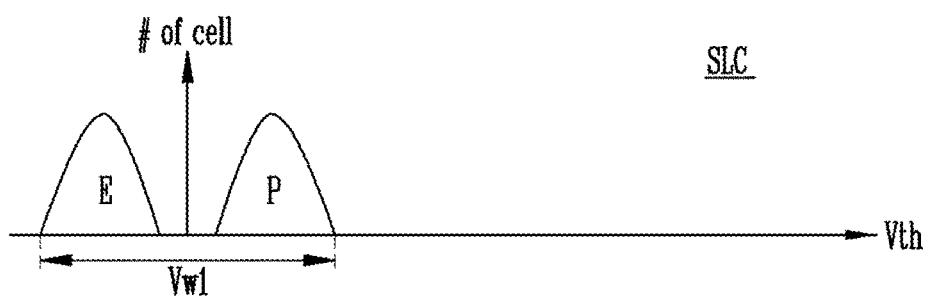
FIG. 7 is a diagram illustrating a threshold voltage distribution according to a number of data bits which a memory cell stores.
Figure 7:
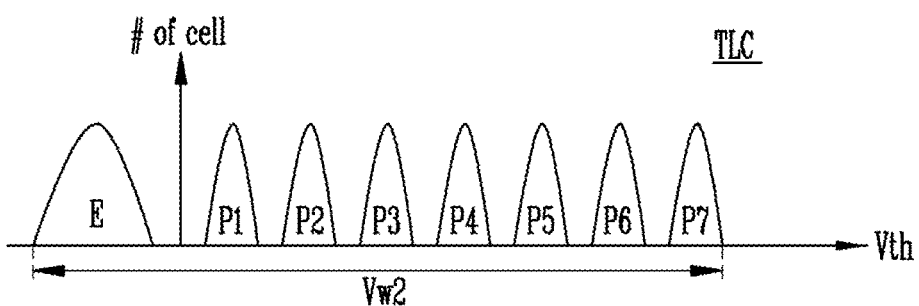

FIG. 7 is a diagram illustrating a threshold voltage distribution according to a number of data bits which a memory cell stores.

Referring to FIG. 7, a single level cell SLC may be a memory cell which stores one data bit. A triple level cell TLC may be a memory cell which stores three data bits.

The single level cell SLC may be programmed to any one of an erase state E and a program state P. The triple level cell TLC may be programmed to any one of the erase state E and first to seventh program states P1 to P7.

Vw1 may be a voltage window of a threshold voltage distribution which the single level cell SLC has. Vw2 may be a voltage window of a threshold voltage distribution which the triple level cell TLC has. The window of a threshold voltage distribution which a memory cell has may become wider as the number of data bits which the memory cell stores becomes larger.

The level of an operating voltage necessary for a memory operation may become higher as the window of the threshold voltage distribution becomes wider. The memory operation may include at least one of a program operation, an erase operation, and a read operation. Therefore, power consumption required in the memory device may become larger as the number of data bits which the memory cell stores becomes larger. On the contrary, the power consumption required in the memory device may become smaller as the number of data bits which the memory cell stores becomes smaller.

In an embodiment, the frequency of a pump clock may become higher as the power consumption according to the memory operation becomes larger. The frequency of the pump clock may become lower as the power consumption according to the memory operation becomes smaller. In an embodiment, the frequency of the pump clock is changed according to the power consumption according to the memory device or the number of data bits which a memory cell on which the memory operation is performed stores, so that power consumption efficiency can be improved.

FIG. 8 is a diagram illustrating an operation mode table used by the operation mode storage shown in FIG. 2.

Referring to FIG. 8, the operation mode storage may store an operation mode table including a plurality of pump clocks CLK1 to CLKn (n is a natural number greater than 1) respectively corresponding to a plurality of operation modes OM1 to OMn. At least one pump clock among the plurality of pump clocks CLK1 to CLKn may have a frequency different from that of another clock.

Each of first and second operation mode tables 131a and 131b may be an embodiment of the operation mode table.

In the first operation mode table 131a, a plurality of operation modes may be distinguished from each other according to a number of data bits which a memory cell on which a memory operation is to be performed stores. For example, when the number of data bits which the memory cell stores is 1, a target operation mode may be OM1, and a target pump clock may be CLK1. When the number of data bits which the memory cell stores is 2, the target operation mode may be OM2, and the target pump clock may be CLK2. Similarly, when the number of data bits which the memory cell stores is n, the target operation mode may be OMn, and the target pump clock may be CLKn.

The frequency of the target pump clock may become higher as the number of data bits which the memory cell on which the memory operation is to be performed stores becomes larger. The frequency of the target pump clock may become lower as the number of data bits which the memory cell on which the memory operation is to be performed stores becomes smaller. In an embodiment, the frequency of the target pump clock may increase as the number of data bits to be stored corresponding to the memory cell on which the memory operation is to be performed becomes larger. In an embodiment, the frequency of the target pump clock may decrease as the number of data bits to be stored corresponding to the memory cell on which the memory operation is to be performed becomes smaller.

In the second operation mode table 131b, a plurality of operation modes may be distinguished from each other according to a power consumption level of the memory operation. For example, when the power consumption level is 1, the target operation mode may be OM1, and the target pump clock may be CLK1. When the power consumption level is 2, the target operation mode may be OM2, and the target pump clock may be CLK2. Similarly, when the power consumption level is n, the target operation mode may be OMn, and the target pump clock may be CLKn. The frequency of the target pump clock may increase as the power consumption level of the memory operation increases.

The frequency of the target pump clock may become higher as the power consumption level of the memory operation becomes higher. The frequency of the target pump clock may become lower as the power consumption level of the memory operation becomes lower.

Figure 9:
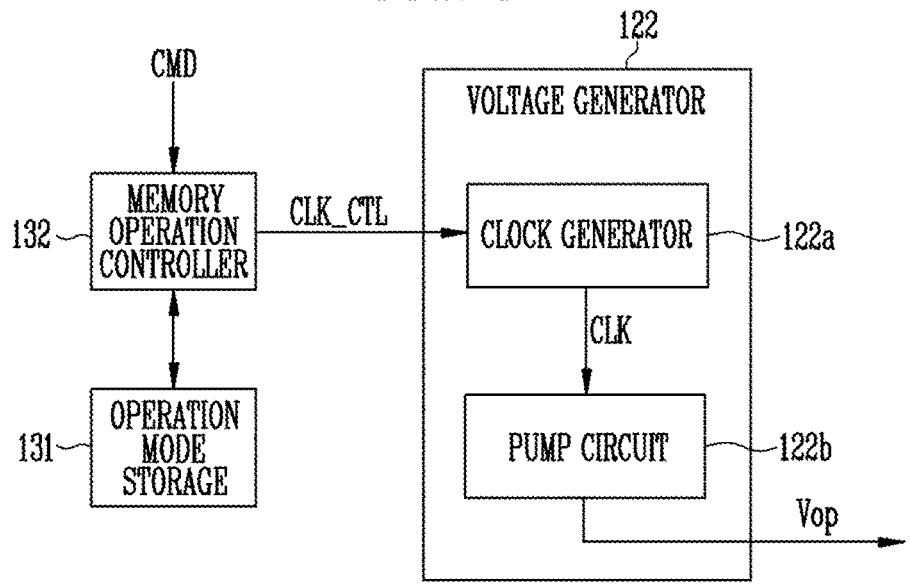
FIG. 9 is a diagram illustrating generation of operating voltages in accordance with an embodiment of the present disclosure.

FIG. 9 is a diagram illustrating generation of operating voltages in accordance with an embodiment of the present disclosure.

Referring to FIG. 9, the operation mode storage 131 may store an operation mode table including a plurality of pump clocks respectively corresponding to a plurality of operation modes. The operation mode table may be configured as described above in FIG. 8.

The memory operation controller 132 may determine a target operation mode among the plurality of operation modes, based on a received command CMD and the operation mode table stored in the operation mode storage 131.

The memory operation controller 132 may select the target operation mode among the plurality of operation modes, based on a number of data bits which a memory cell on which a memory operation according to the command CMD is to be performed stores. The memory operation controller 132 may select a target pump clock CLK corresponding to the target operation mode.

In an embodiment, the memory operation controller 132 may select, as the target pump clock CLK, a pump clock having a lower frequency among the plurality of pump clocks, as the number of data bits which the memory cell stores becomes smaller. In another embodiment, the memory operation controller 132 may select, as the target pump clock CLK, a pump clock having a lower frequency among the plurality of pump clocks, as power consumption required in the memory operation becomes smaller.

The memory operation controller 132 may generate a clock control signal CLK_CTL instructing generation of the target pump clock CLK.

The voltage generator 122 may include a clock generator 122a and a pump circuit 122b.

The clock generator 122a may generate the target pump clock CLK in response to the clock control signal CLK_CTL.

The pump circuit 122b may include a plurality of pumps. The pump circuit 122b may generate a plurality of operating voltages Vop, based on the target pump clock CLK. The plurality of operating voltages Vop may include at least one of a program voltage, an erase voltage, a pass voltage, a verify voltage, a read voltage, and a negative voltage.

Figure 10:
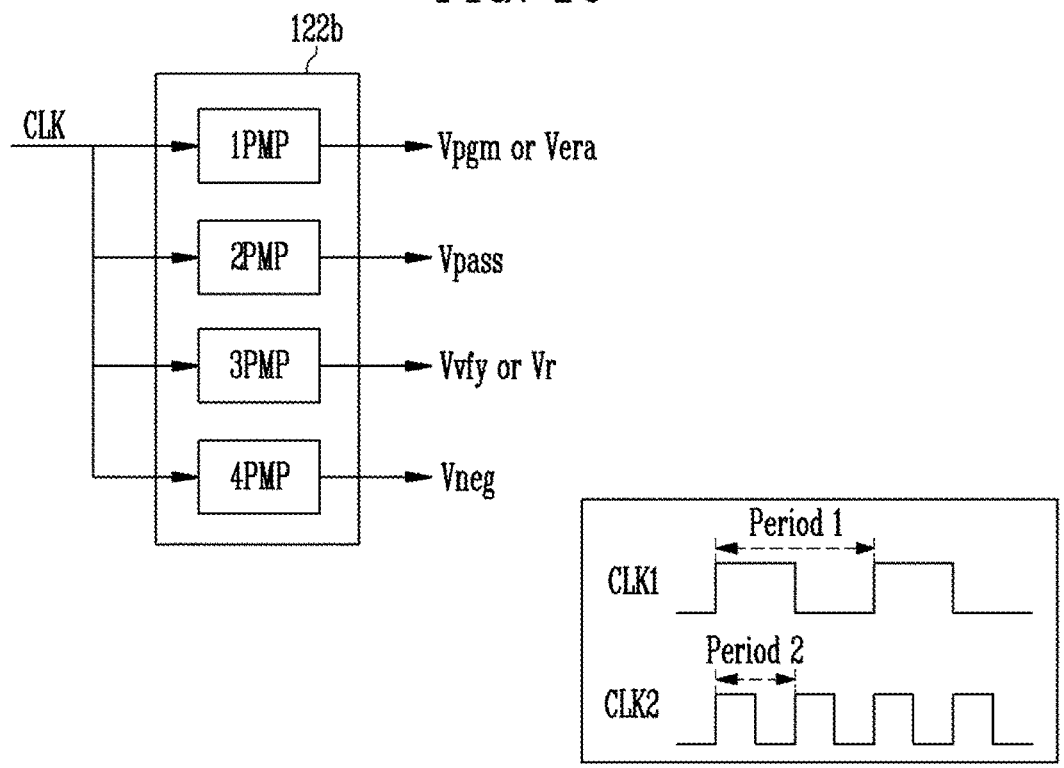
FIG. 10 is a diagram illustrating a configuration and an operation of a pump circuit shown in FIG. 9.

FIG. 10 is a diagram illustrating a configuration and an operation of the pump circuit shown in FIG. 9.

Referring to FIG. 10, the pump circuit may include first to fourth pumps 1PMP-4PMP.

The first pump 1PMP may output one of a program voltage Vpgm and an erase voltage Vera based on the memory operation to be performed, and, based on the target pump clock CLK, the levels of the program voltage Vpgm and the erase voltage Vera output for the memory operation may be adjusted. The second pump 2PMP may output a pass voltage Vpass, based on the target pump clock CLK. The third pump 3PMP may output one of a verify voltage Vvfy and a read voltage Vr based on the memory operation to be performed, and, based on the target pump clock CLK, the levels of the verify voltage Vvfy and the read voltage Vr output for the memory operation may be adjusted. The fourth pump 4PMP may output a negative voltage Vneg, based on the target pump clock CLK.

The level of the output voltage may become higher as the frequency of the target pump clock CLK becomes higher. The level of the output voltage may become lower as the frequency of the target pump clock CLK becomes lower. For example, the program voltage Vpgm or the erase voltage Vera may increase as the frequency of the target pump clock CLK increases. For example, the program voltage Vpgm or the erase voltage Vera may decrease as the frequency of the target pump clock CLK decreases. For example, the pass voltage Vpass may increase as the frequency of the target pump clock increases. For example, the pass voltage Vpass may decrease as the frequency of the target pump clock decreases. For example, the verify voltage Vvfy or the read voltage Vr may increase as the frequency of the target pump clock CLK increases. For example, the verify voltage Vvfy or the read voltage Vr may decrease as the frequency of the target pump clock CLK decreases. For example, the negative voltage Vneg may increase as the frequency of the target pump clock CLK increases. For example, the negative voltage Vneg may decrease as the frequency of the target pump clock CLK decreases.

Therefore, when the power consumption level of the memory operation is low, CLK1 having a low frequency between CLK1 and CLK2 may be selected as the target pump clock CLK. When the power consumption level of the memory operation is high, CLK2 having a high frequency between CLK1 and CLK2 may be selected as the target pump clock CLK.

As described with reference to FIG. 7, the power consumption of the memory operation may become larger as the number of data bits which the memory cell on which the memory operation is to be performed stores becomes larger. The power consumption of the memory operation may become smaller as the number of data bits which the memory cell on which the memory operation is to be performed stores becomes smaller. Therefore, when the number of data bits which the memory cell on which the memory operation is to be performed stores becomes smaller, CLK1 having a low frequency between CLK1 and CLK2 may be selected as the target pump clock CLK. When the number of data bits which the memory cell on which the memory operation is to be performed stores becomes larger, CLK2 having a high frequency between CLK1 and CLK2 may be selected as the target pump clock CLK.

The target pump clock CLK is not limited to this embodiment, and may be selected among the plurality of pump clocks. A pump clock having a lower frequency among the plurality of pump cocks may be selected as the target pump clock CLK as the power consumption level of the memory operation becomes lower. A pump clock having a lower frequency among the plurality of pump cocks may be selected as the target pump clock CLK as the number of data bits which the memory cell on which the memory operation is to be performed stores becomes smaller.

Figure 11:
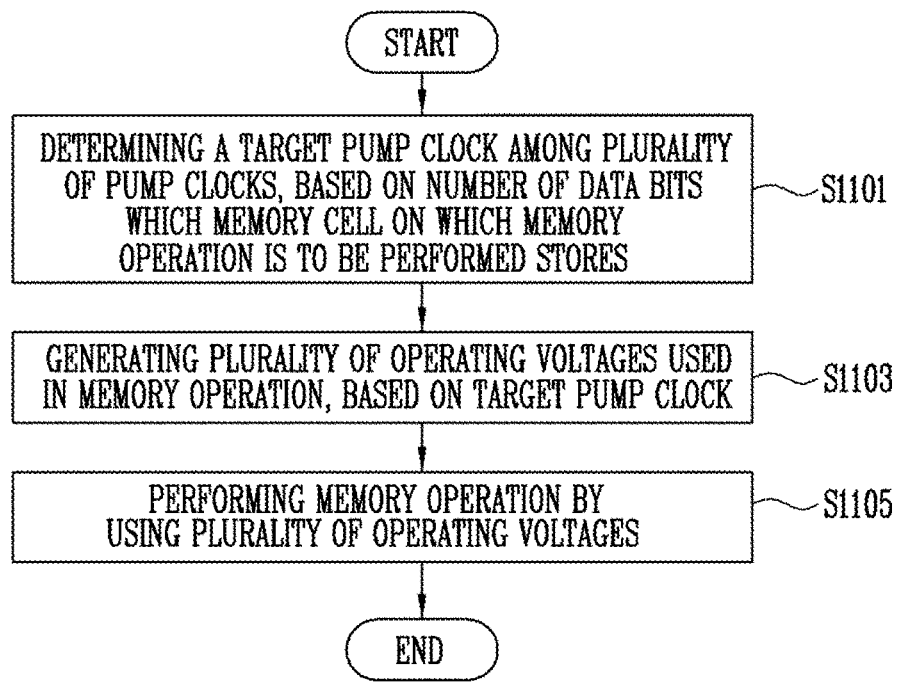
FIG. 11 is a flowchart illustrating an operation of the memory device in accordance with an embodiment of the present disclosure.

FIG. 11 is a flowchart illustrating an operation of the memory device in accordance with an embodiment of the present disclosure.

Referring to FIG. 11, in step S1101, the memory device may determine a target pump clock among a plurality of pump clocks, based on a number of data bits which a memory cell on which a memory operation is to be performed stores.

In step S1103, the memory device may generate a plurality of operating voltages used in the memory operation, based on the target pump clock.

In step S1105, the memory device may perform the memory operation by using the plurality of operating voltages.

FIG. 12 is a flowchart illustrating in detail the flowchart shown in FIG. 11.

Referring to FIG. 12, in step S1201, the memory device may select a target operation mode among a plurality of operation modes, based on a number of data bits which a memory cell on which a memory operation is to be performed stores.

In step S1203, the memory device may select a target pump clock corresponding to the target operation mode, based on an operation mode table.

In step S1205, the memory device may generate a clock control signal instructing generation of the target pump clock.

In step S1207, the memory device may generate the target pump clock, based on the clock control signal.

In an embodiment, the step S1101 may correspond to the steps S1201 and S1203. The step S1103 may correspond to the steps S1205 and S1207.

In accordance with the present disclosure, in an embodiment, there can be provided a memory device having improved power consumption in a memory operation and an operating method of the memory device.

While the present disclosure has been shown and described with reference to certain examples of embodiments thereof, it will be understood by those skilled in the art that various changes in form and details may be made therein without departing from the spirit and scope of the present disclosure as defined by the appended claims and the equivalents thereof. Therefore, the scope of the present disclosure should not be limited to the above-described examples of embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, these are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a plurality of memory cells;
a peripheral circuit configured to generate a plurality of operating voltages used in a memory operation, based on a target pump clock, and perform the memory operation by using the plurality of operating voltages; and control logic configured to select the target pump clock among a plurality of pump clocks based on a number of data bits which selected memory cells, on which the memory operation is to be performed among the plurality of memory cells, store, and configured to control the peripheral circuit to perform the memory operation on the selected memory cells, wherein a frequency of the target pump clock is differently selected according to the number of data bits.

2. The memory device of claim 1, wherein the control logic includes:

an operation mode storage configured to store an operation mode table including the plurality of pump clocks respectively corresponding to a plurality of operation modes; and a memory operation controller configured to select a target operation mode among the plurality of operation modes, based on a command received externally from the memory device, and select the target pump clock corresponding to the target operation mode, based on the operation mode table.

3. The memory device of claim 2, wherein at least one pump clock among the plurality of pump clocks has a frequency different from that of another pump clock.

4. The memory device of claim 2, wherein the memory operation controller selects, as the target pump clock, a pump clock having a lower frequency among the plurality of pump clocks, as power consumption required in the memory operation becomes smaller.

5. The memory device of claim 2, wherein the memory operation controller selects the target operation mode among the plurality of operation modes, based on the number of data bits which the selected memory cells on which the memory operation is to be performed according to the command store.

6. The memory device of claim 5, wherein the memory operation controller selects, as the target pump clock, a pump clock having a lower frequency among the plurality of pump clocks, as the number of data bits which the selected memory cells store becomes smaller.

7. The memory device of claim 2, wherein the memory operation controller generates a clock control signal instructing generation of the target pump clock, and wherein the peripheral circuit includes a voltage generator configured to generate the target pump clock in response to the clock control signal, and generate the plurality of operating voltages, based on the target pump clock.

8. The memory device of claim 7, wherein the voltage generator includes:

a clock generator configured to generate the target pump clock in response to the clock control signal; and a pump circuit configured to generate the plurality of operating voltages, based on the target pump clock.

9. The memory device of claim 8, wherein the pump circuit includes:

a first pump configured to output one of a program voltage and an erase voltage based on the target pump clock;

a second pump configured to output a pass voltage, based on the target pump clock;

a third pump configured to output one of a verify voltage and a read voltage based on the target pump clock; and a fourth pump configured to output a negative voltage, based on the target pump clock.

10. The memory device of claim 1, wherein the memory operation includes at least one of a program operation, a read operation, and an erase operation on the selected memory cells.

11. A method for operating a memory device including a plurality of memory cells, the method comprising:

determining a target pump clock among a plurality of pump clocks, based on a number of data bits which selected memory cells on which a memory operation is to be performed among the plurality of memory cells store;

generating a plurality of operating voltages used in the memory operation, based on the target pump clock; and performing the memory operation by using the plurality of operating voltages, wherein a frequency of the target pump clock is differently selected according to the number of data bits.

12. The method of claim 11, wherein the determining of the target pump clock includes:

selecting a target operation mode among a plurality of operation modes, based on the number of data bits which the selected memory cells on which the memory operation is to be performed among the plurality of memory cells according to a command received externally from the memory device store; and selecting the target pump clock corresponding to the target operation mode, based on an operation mode table including the plurality of pump clocks respectively corresponding to the plurality of operation modes.

13. The method of claim 12, wherein the selecting of the target pump clock includes selecting, as the target pump clock, a pump clock having a lower frequency among the plurality of pump clocks, as the number of data bits which the selected memory cells store becomes smaller.

14. The method of claim 12, wherein the selecting of the target pump clock includes selecting, as the target pump clock, a pump clock having a lower frequency among the plurality of pump clocks, as power consumption required in the memory operation becomes smaller.

15. The method of claim 11, wherein at least one pump clock among the plurality of pump clocks has a frequency different from that of another pump clock.

16. The method of claim 11, wherein the generating of the plurality of operating voltages includes:

generating a clock control signal instructing generation of the target pump clock;

generating the target pump clock in response to the clock control signal; and generating the plurality of operating voltages, based on the target pump clock.

17. The method of claim 11, wherein the plurality of operating voltages include at least one of a program voltage, an erase voltage, a pass voltage, a verify voltage, a read voltage, and a negative voltage.

18. The method of claim 11, wherein the memory operation includes at least one of a program operation, a read operation, and an erase operation on the selected memory cells.

* * * * *